United States Patent [19]
Gobbi et al.

[11] Patent Number: 6,114,930
[45] Date of Patent: *Sep. 5, 2000

[54] IMPEDANCE CONTROLLED BY THE PHASE ANGLE BETWEEN TWO SIGNALS

[75] Inventors: José-Maria Gobbi, Stockholm; Ted Johansson, Djursholm, both of Sweden

[73] Assignee: Telefonaktiebolaget LM Ericsson, Stockholm, Sweden

[ * ] Notice: This patent issued on a continued prosecution application filed under 37 CFR 1.53(d), and is subject to the twenty year patent term provisions of 35 U.S.C. 154(a)(2).

[21] Appl. No.: 09/084,705

[22] Filed: May 26, 1998

Related U.S. Application Data

[63] Continuation of application No. PCT/SE96/01557, Nov. 27, 1996.

[30] Foreign Application Priority Data

Nov. 27, 1995 [SE] Sweden .................................. 9504230

[51] Int. Cl.[7] .................................................. H03H 11/52
[52] U.S. Cl. .......................... 333/214; 333/217; 327/285; 327/553; 331/115
[58] Field of Search ............................ 331/115; 323/259; 327/285, 553; 333/213, 214, 216, 217

[56] References Cited

U.S. PATENT DOCUMENTS

| | | | |
|---|---|---|---|
| 2,422,422 | 6/1947 | Korman | 333/214 X |
| 2,797,328 | 6/1957 | Miller, Jr. | 331/115 X |
| 3,416,105 | 12/1968 | Vallese | 333/214 |
| 4,232,280 | 11/1980 | Forward | 333/213 |
| 4,338,582 | 7/1982 | Presser | 333/175 |
| 5,343,172 | 8/1994 | Utsu et al. | 333/32 |

FOREIGN PATENT DOCUMENTS

| | | |
|---|---|---|
| 0 356 109 | 2/1990 | European Pat. Off. . |
| 0 523 450 | 1/1993 | European Pat. Off. . |
| 3323649 | 2/1985 | Germany ................................. 333/213 |

OTHER PUBLICATIONS

Nguyen, Nhat M. et al., "Si IC–Compatible Inductors and LC Passive Filters", *IEEE, Journal of Solid States Circuits*, vol. 25, No. 4, p1028–1033, Aug. 1990.

Presser, A., "Varactor–Tunable, High–Q Microwave Filter", *RCA Review*, vol. 42, pp691–705, 1981.

*Primary Examiner*—Justin P. Bettendorf
*Attorney, Agent, or Firm*—Burns, Doane, Swecker & Mathis, L.L.P.

[57] ABSTRACT

An impedance device has a first conductor and a second conductor, the first and second conductors being positioned in relation to each other so as to provide magnetic coupling between them. The impedance of the impedance device is controlled by receiving, in the first conductor, a first electric signal having a first amplitude and a first phase angle, generating a second electric signal having a second amplitude and a second phase angle, delivering the second electric signal to the second conductor, and controlling the second phase angle.

40 Claims, 9 Drawing Sheets

FIG.1A
PRIOR ART
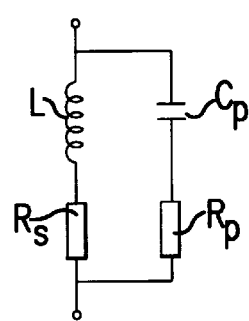
FIG.1B
PRIOR ART
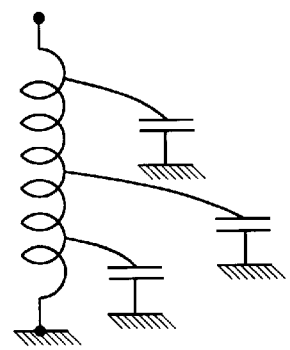
FIG.1C
PRIOR ART
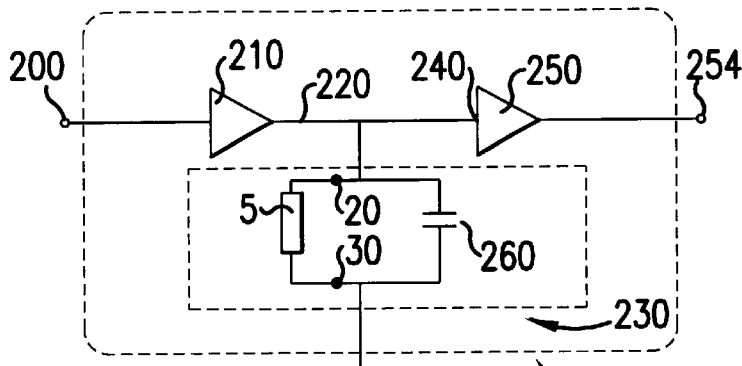
FIG.7
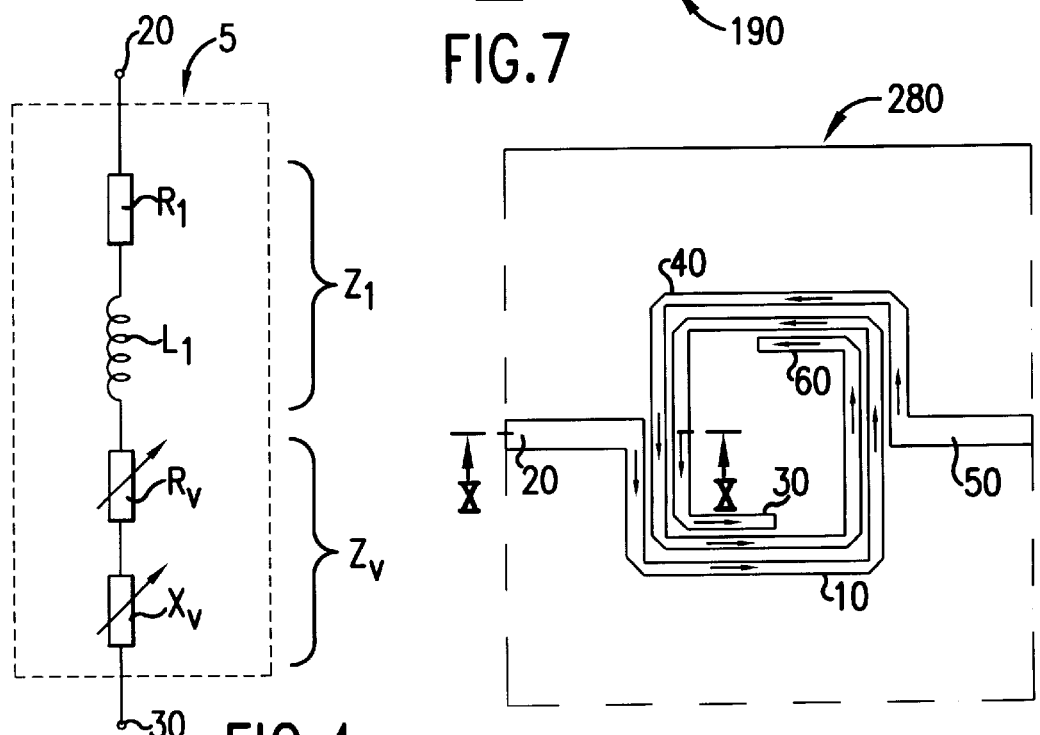
FIG.4
FIG.9

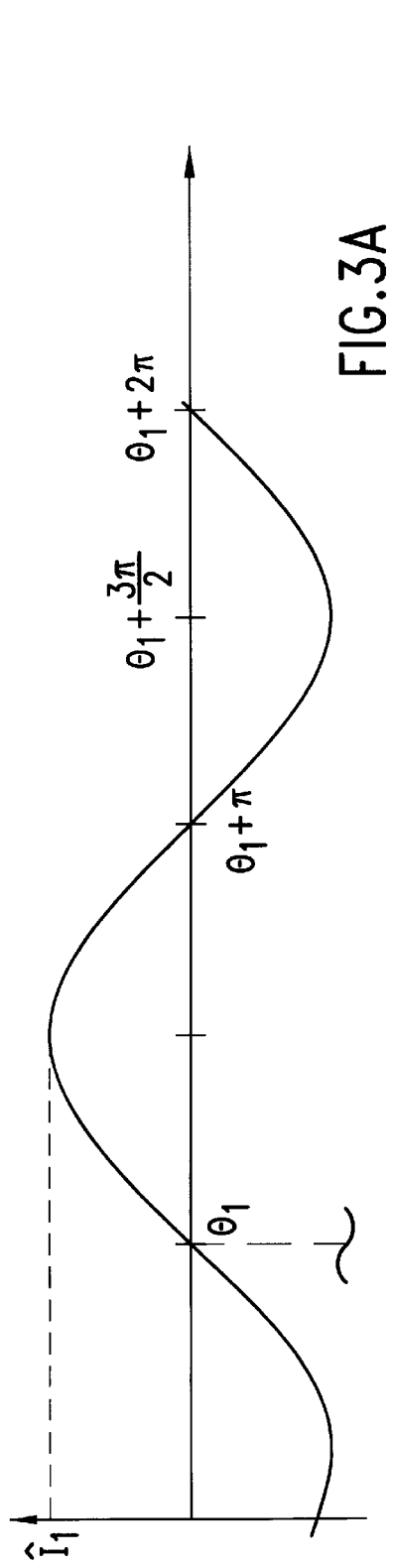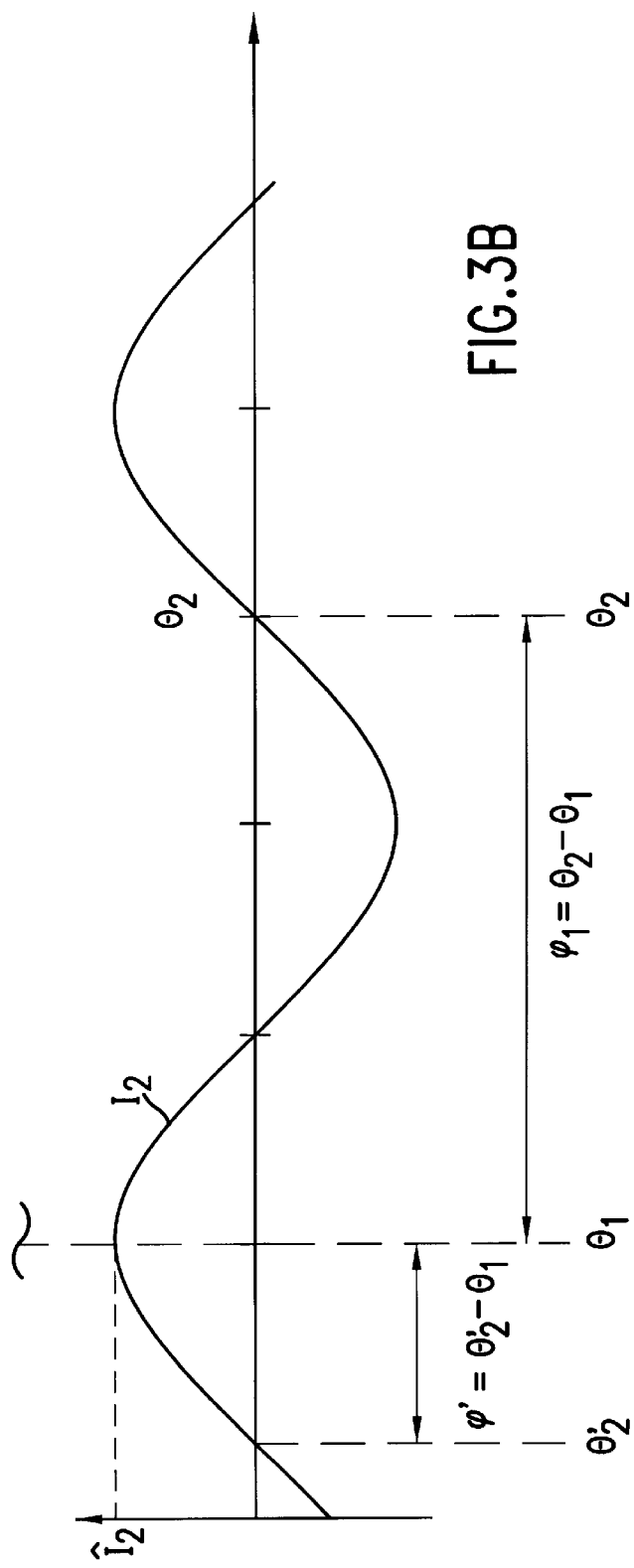

IMPEDANCE CONTROLLED BY THE PHASE ANGLE BETWEEN TWO SIGNALS

This application is a continuation of International Application No. PCT/SE96/01557, which was filed on Nov. 27, 1996, which designated the United States, and which is expressly incorporated here by reference.

BACKGROUND

The present invention relates to an impedance means and to a method for adjusting the impedance of the impedance means. The invention also relates to electronic circuits including such an impedance means. The invention also relates to an integrated circuit chip.

A circuit component is frequently described as having an impedance Z with a resistive part and a reactive part. In other words a component has a resistance R and a reactance X. The reactance may be capacitive or inductive. The reactance X may include a capacitive component as well as an inductive component, rendering the impedance of the component inductive and capacitive as well as resistive.

Resonator circuits are components used in electronic circuits such as filters and oscillators. U.S. Pat. No. 4,338,582 discloses a resonant circuit comprising an inductor, a varactor and a resistor coupled with a Field Effect Transistor. The Field Effect Transistor is arranged to exhibit negative resistance, so as to compensate for a large resistive component exhibited by the varactor.

The publication "Varactor-Tunable, High-Q Microwave Filter" by A. Presser (RCA Review, Vol 42, pp 691–705, 1981) also concludes that varactor losses can be compensated by the negative resistance of an active element. Presser discloses a Field Effect Transistor which is connected in a feedback configuration so as to provide the negative resistance. The disclosed Field Effect Transistor is connected in series with a varactor with resistive losses.

The article "SiIc-Compatible Inductors and LC Passive Filters" (IEEE Journal of Solid-State Circuits, Vol. 25, No. 4, 1990) by N. M. Nguyen and R. G. Meyer, discloses a square spiral inductor which is fabricated of aluminium on a silicon substrate. The disclosed inductor having an inductance of 9.7 nH also had a series resistance of 15.4 Ω and a maximum Q-value below 4 at 0.9 GHz. The article also discloses a low pass filter including two inductors with mutual inductance between them. Although a Q-value of about 3 is usable, the performance of the disclosed inductors is still limited by metal resistance.

EP, A2, 0 356 109 describes a low frequency inductance transformer having a primary winding and a secondary winding. A sensor transformer senses the current in the primary winding of the inductance transformer and an operational amplifier, responsive to the sensed current, is described for controlling the current in the secondary winding to increase the inductance effect of the primary winding.

SUMMARY

The invention relates to the problem of providing an impedance means with a controllable impedance.

The invention also relates to the problem of providing an inductor having an advantageously high Q-value. Integrated circuit inductors according to the prior art suffer from particularly low Q-values. Another problem associated with the prior art is that the operating frequency of integrated circuit inductors is limited by parasitic capacitances.

Furthermore the invention relates to the problem of providing an integrated circuit inductor with advantageous performance characteristics at high frequencies.

It is an object of the present invention to achieve a method for controlling the impedance of a circuit component. Provision of such a method enables electronic adjustment of the resistance as well as the reactance of a circuit component. Such control of the impedance enables adjustment of the quality factor $Q_0$ of the component, and it also enables control of the resonance frequency $\omega_0$ for the component, as well as control of the resonance frequency for any circuit including the component.

An additional object of the present invention is to achieve an inductance means in which the quality factor is adjustable.

It is also an object of the present invention to achieve a component in which the resistance is adjustable. A further object of the present invention is to achieve a component in which the reactance is adjustable.

In order to satisfy the above mentioned objects the component may include a first terminal and a second terminal to which a first conductor is coupled. The impedance $Z_e$ of the component between the terminals 20 and 30 may be represented by the relation:

$$Z_e = R_e + jX_e$$

where $R_e$ is the resistance of the component, and $X_e$ is the reactance of the component.

The component also includes a second conductor. The second conductor is electromagnetically coupled to the first conductor.

The method according to the invention includes the step of receiving a first electric signal in the first conductor. The first electric signal has a first amplitude and a first phase angle. A signal generator is provided for generating a second electric signal. The signal generator delivers the second electric signal to the second conductor. The second electric signal has a second amplitude and a second phase angle. The signal generator comprises means for controlling the second phase angle.

The resistance $R_e$ of the component varies in response to the angular difference between the second phase angle and the first phase angle. In accordance with the invention the resistance of the component can be changed by changing the angular difference between the second phase angle and the first phase angle.

The second electric signal can be generated in response to the first electric signal. Alternatively the second electric signal depends on the first electric signal in the sense that both signals are generated in response to a third electric signal.

According to one embodiment of the invention the control means comprises a sensor means for generating said second electric signal in response to said first electric signal. According to an embodiment of the invention the control means also comprises an input for an adjustment signal. The control means is devised to control the second phase angle in response to the adjustment signal.

An additional object of the present invention is to achieve an inductance means having an inductance, the value of which is electronically adjustable. Another object of the present invention is to achieve an inductance means having a resistance, the value of which is electronically adjustable.

These objects are achieved by providing an adjustment means for adjusting the amplitude and the phase of the second signal.

An additional object of the present invention is to achieve an integrated circuit chip comprising an inductance means with advantageous characteristics. A further object of the invention is to achieve an integrated circuit inductance means operating at frequencies above 300 MHz with an improved Q-value. These objects are achieved by providing an integrated circuit with first and second conductors which are coupled electromagnetically. According to one embodiment of the invention the first conductor is shaped as a spiral, and the second conductor is also shaped as a spiral. The first spiral and the second spiral are intercoiled so as to provide said magnetic coupling between said inductors.

BRIEF DESCRIPTION OF THE DRAWINGS

For simple understanding of the present invention, it will be described by means of examples and with reference to the accompanying drawings, of which:

FIG. 1A is a schematic representation of an inductor, according to prior art, having an inductive and a resistive impedance.

FIG. 1B is a schematic representation of an inductor, according to prior art, having a capacitive as well as inductive and resistive impedance.

FIG. 1C illustrates the principle of parasitic capacitance appearing in connection with prior art inductors.

FIGS. 3A and 3B illustrate a first electric signal having an amplitude $\hat{I}_1$ and a phase angle $\theta_1$, and a second electric signal having a second amplitude $\hat{I}_2$ and a second phase angle $\theta_2$, respectively.

FIG. 4 is a schematic representation of the impedance means in FIG. 2.

FIG. 7 is schematic block diagram of a filter circuit comprising an inductance means according to the invention.

FIG. 9 is a top view of a portion of an integrated circuit chip including an integrated transformer having a first conductor positioned so as to provide a mutual inductance with the second conductor.

DETAILED DESCRIPTION

Figure 2:
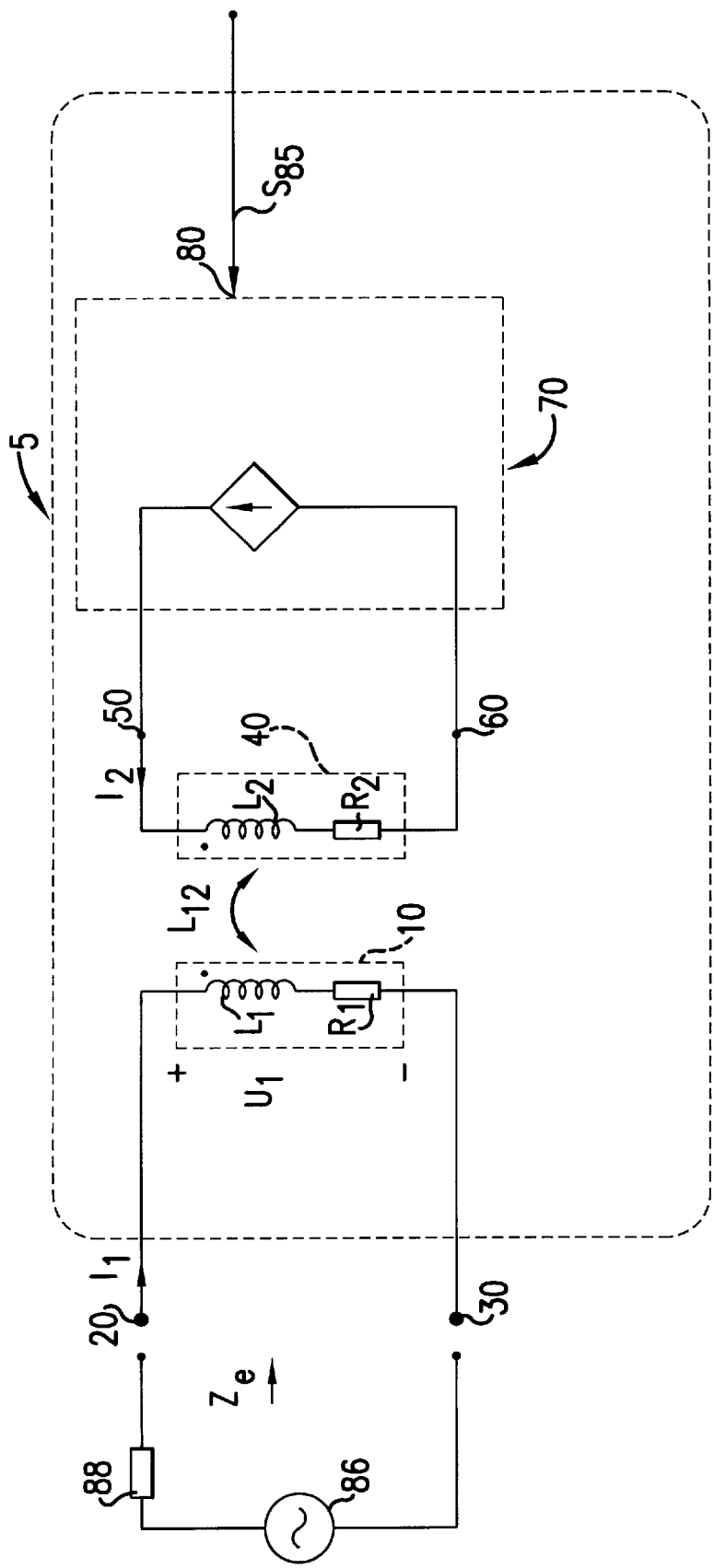
FIG. 2 shows a schematic block diagram of a first embodiment of an impedance means according to the invention.

In the following description similar features in different embodiments will be indicated by the same reference numerals.

A First Embodiment

FIG. 2 shows a schematic block diagram of a component 5 including an inductor 10 having a self-inductance L1 and an effective power loss which, in FIG. 4 is represented by a series resistance R1. The inductor 10 is coupled to a first terminal 20 and to a second terminal 30.

The component 5 also includes a second inductor 40 having a self-inductance $L_2$ and a resistive loss, which, in FIG. 2, is represented by a series resistance $R_2$. The inductor 40 is positioned in relation to the first inductor 10 so as to provide electromagnetic coupling between them. In other words there is a mutual inductance $L_{12}$ between the first inductor 10 and the second inductor 40. The inductor 40 has a terminal 50 and a terminal 60 both of which are connected to a signal generator 70. The signal generator 70 includes an input terminal 80 for a first control signal $S_{85}$.

A signal source 86 delivers a first oscillating electric signal through a source impedance 88, having a value $R_{88}$, to terminal 20. When the first electric signal, such as a current $I_1$ having a frequency $f_1$, an amplitude $\hat{I}_1$ and a phase angle $\theta_1$, is delivered to the inductor 10, the signal generator 70 is activated to provide a second oscillating electric signal, such as a current $I_2$ having an amplitude $\hat{I}_2$ and a phase angle $\theta_2$ to the second inductor 40. By means of the first control signal the amplitude $\hat{I}_2$ and the phase angle $\theta_2$ of the second electric signal are electronically controllable. The first control signal also enables control of the frequency or the frequencies of the second electric signal.

FIG. 3A illustrates the input signal to terminal 20 having an amplitude $\hat{I}_1$ and a phase angle $\theta_1$. FIG. 3B illustrates the second electric signal having the amplitude $\hat{I}_2$ and the phase angle $\theta_2$. The second phase angle $\theta_2$ is controllable to differ from the phase angle $\theta_1$ so as to provide a first phase angle difference $\phi_1$. The first electric angle difference $\phi_1$ has an influence on the impedance of the component 5. This will be described in detail below.

When the current $I_1$ is applied to terminal 20 in the circuit of FIG. 2, there will be a response voltage $U_1$ across the inductor 10. An analysis of the circuit 5 with the precondition of exciting the second inductor 40 with the second current $I_2$, as described above, renders a response function $U_1/I_1=Z_e$, where $Z_e$ is the impedance of the circuit 5. Exciting the second inductor 40 generates a feedback signal in the first inductor 10 in response to the electric signal in inductor 40, thereby influencing the impedance $Z_e$ of the circuit 5 between the terminals 20 and 30.

The impedance $Z_e$ of the circuit 5 between the terminals 20 and 30 may be represented by the relation:

$$Z_e = U_1/I_1 = R_e + jX_e \quad (1)$$

An analysis reveals that $$R_e = R_1 - \omega L_{12}(I_2/I_1)\sin \phi_1 \quad (2)$$

$$X_e = \omega L_1 + \omega L_{12}(I_2/I_1)\cos \phi \quad (3)$$

It is clear from equation (2) that the resistive or real term $R_e$ comprises a term which depends on the angle difference $\phi_1 = \theta_2 - \theta_1$.

The factor $\sin \phi_1 = \sin(\theta_2 - \theta_1)$ will have a positive sign for certain ranges of the angle $\phi_1$, and it will have a negative sign for other ranges of the angle $\phi_1$. Accordingly, the resistance $R_e$ can be varied as a function of the angle $\phi_1$.

Similarly equation (3) reveals that the reactance $X_e$ may be varied as a function of the angle $\phi$.

Equations (1), (2) and (3) may be rewritten to read:

$$Z_e = R_1 + j\omega L_1 + \omega L_{12}(I_2/I_1)(-\sin \phi_1 + j\cos \phi_1) \quad (4)$$

$$Z_e = R_1 + j\omega L_1 - \omega L_{12}(I_2/I_1)\sin \phi_1 + j\omega L_{12}I_2/I_1 \cos \phi_1 \quad (5)$$

The first two terms in equation (5) are independent of the angle $\phi_1$, while the last two terms are functions of $\phi_1$.

Equation (5) can thus be rewritten as $$Z_e = R_1 + j\omega L_1 + R_v + jX_v \quad (6)$$

where $$R_v = -\omega L_{12}(I_2/I_1)\sin \phi_1 \quad (7)$$

$$X_v = \omega L_{12}(I_2/I_1)\cos \phi_1 \quad (8)$$

The terms $R_v$ and $X_v$ in equation (6) are clearly variable in response to $\phi_1$.

The total impedance of the circuit 5 between terminals 20 and 30 may thus be represented by the relation $$Z_e = Z_1 + Z_v \quad (9)$$

where $$Z_1 = R_1 + j\omega L_1 \quad (10)$$

$$Z_v = R_v + jX_v \quad (11)$$

Thus the circuit according to the invention has the advantageous effect of providing an adjustable impedance $Z_v$, the values of which can be controlled by means of the first control signal, as described above. FIG. 4 is a schematic representation of the circuit 5. As illustrated by equation (9) and FIG. 4 the circuit 5 functions to produce an impedance $Z_1$, coupled to a variable impedance $Z_v$.

The inventors realised that by setting the above described resistance value $R_v$ (see FIG. 4) to a value near the resistance value $R_1$, but with an opposite sign, the impedance means 5 can be controlled to function as an inductance means with a controlled and improved Q-value.

The impedance means 5, according to the invention, may be used for providing a negative resistance value $R_v$.

The quality factor Q of a circuit is commonly defined as the ratio of the reactance of the circuit to its equivalent series resistance. Applying the above definition of quality factor to the impedance means 5, using equations (1) and (6) leads to:

$$Q_5 = X_e/R_e = (\omega L + X_v)/(R_1 + R_v) \quad (12)$$

Providing the second electric signal $I_2$ with a suitable phase angle $\theta_2$ enables provision of a negative resistance value $R_v$ leading to the denominator of the ratio (12) approaching zero. Accordingly the quality factor $Q_5$ is adjustable in response to the phase angle $\theta_2$, and with a suitable phase angle $\theta_2$ the quality factor of the circuit can be significantly improved.

The problem of achieving an inductance means with an advantageously high Q-value is thus solved.

Another object which is achieved with the invention is to provide an integrated circuit inductor having a high resonance frequency.

The resonant frequency for an inductor is proportional to the reciprocal of the square root of the product of the inductance and the parasitic capacitance associated with the inductor:

$$f_o = 1/(\sqrt{(LC_p)}) \quad (13)$$

It can be seen from equation (13) that the resonant frequency $f_o$ is limited by the product of L and $C_p$. For a chosen inductance value L it would be necessary to decrease the capacitance $C_p$ in order to increase the resonant frequency $f_o$. Accordingly, the resonant frequency for a chosen inductance value L is increased if the relation $L/C_p$ is increased. When the inductance means 5 is used, the provided reactance value is controllable, as described above. Substituting the inductance value L in equation (13) for the reactance value $X_e$ from equation (3) gives the following expression for resonance frequency:

$$f_{O5} = 1/(\sqrt{(L_1 + L_{12}I_2/I_1 \cos \phi_1)^* C_p}) \quad (14)$$

Figure 6A:
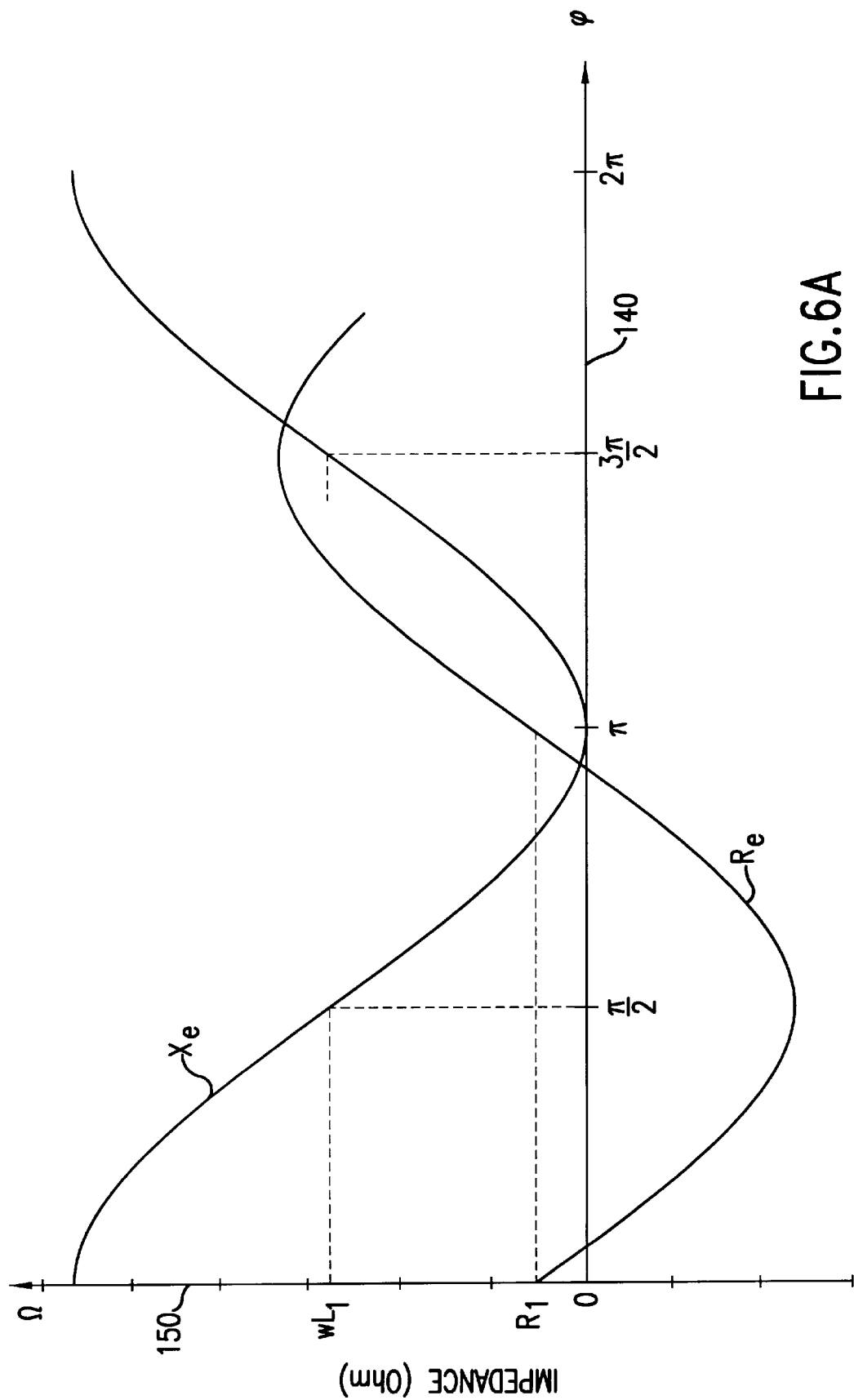
FIG. 6A is a plot of the resistive and the reactive impedances achieved with the impedance means shown in FIGS. 2, 4 and 5.
Figure 6B:
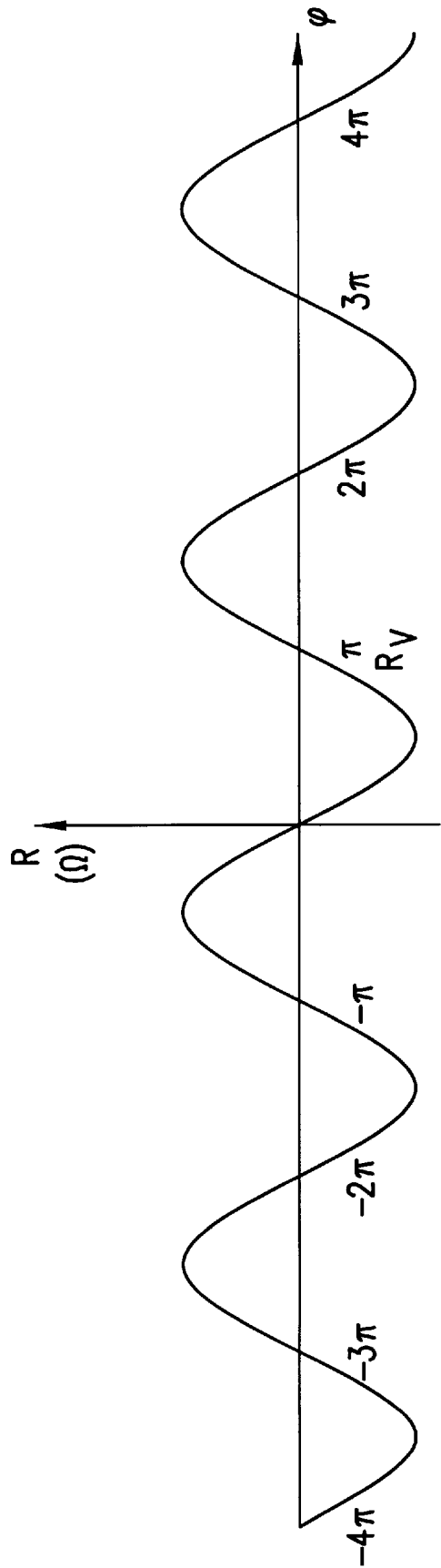
FIG. 6B is a plot of a generated variable resistance achieved with the impedance means shown in FIGS. 2, 4 and 5.

If the angle $\phi_1$ is set within the range $-\pi/2$ to $\pi/2$, the inductance provided by the inductance means 5 is maximized, which is clearly seen in FIGS. 6A and 6B. Accordingly the relation between the inductance value and the parasitic capacitance is increased, thereby providing a higher resonant frequency for a certain inductance value. Accordingly the resonant frequency $f_{O5}$ for the inductance means 5 can be set to a higher value than the resonant frequency for a single inductor.

By providing the inductor 10 in the means 5 with a very low, or negligible resistive loss, the means 5 functions as a reactance means. The reactance of the reactance means 5 is variable in response to the angle $\phi$.

A Second Embodiment

Figure 5:
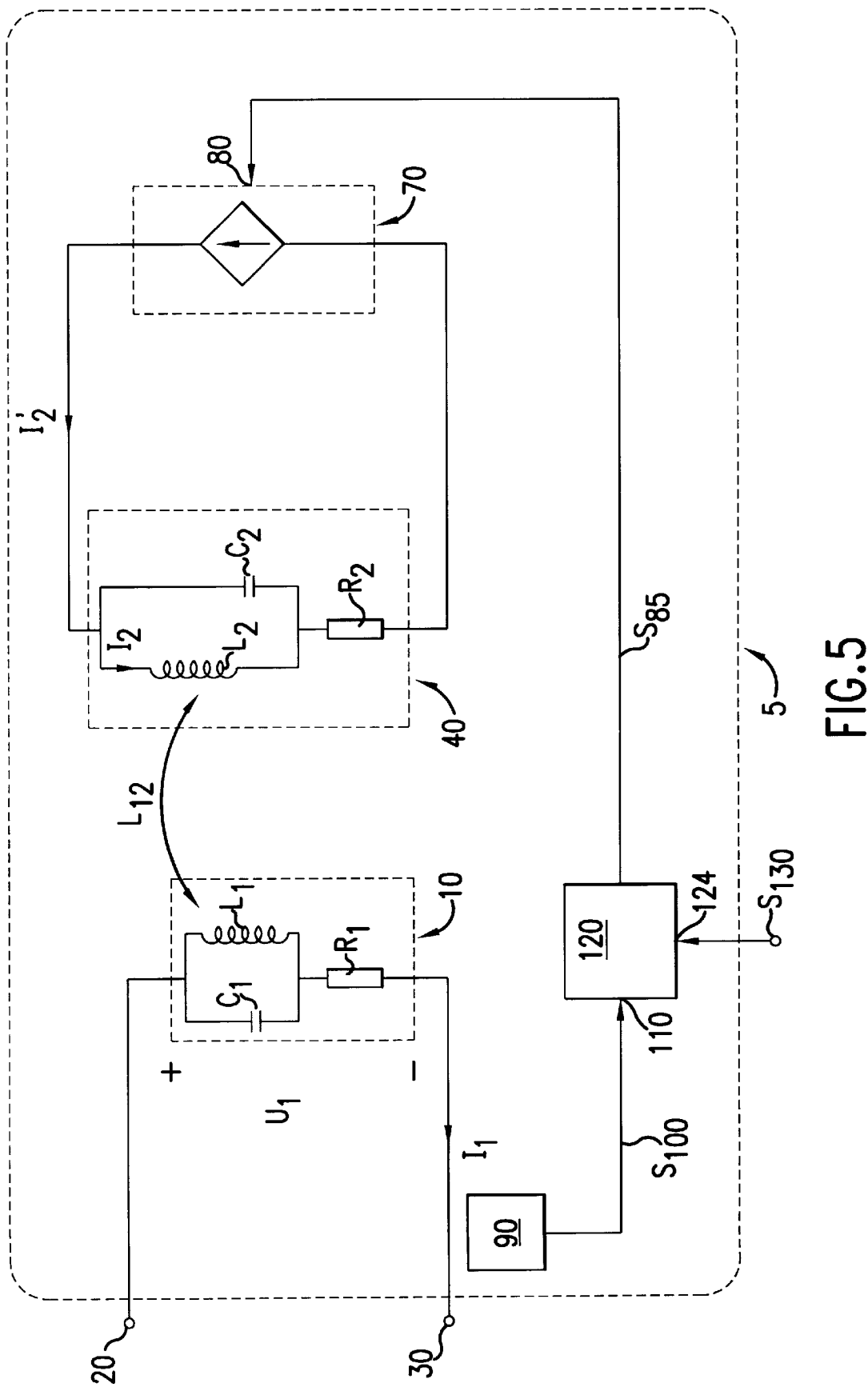
FIG. 5 is a schematic block diagram of a second embodiment of an impedance means according to the invention.

A second embodiment of the impedance means according to the invention is presented in FIG. 5.

A sensor 90 is set up to generate a first indicator signal $S_{100}$ and to deliver the first indicator signal to a first input 110 of a controller 120. The first indicator signal $S_{100}$ is generated in response to the first current $I_1$, so as to comprise information relating to frequency $\omega_1$, amplitude $\hat{I}_1$ and phase angle $\theta_1$ of the first electric signal $I_1$.

The controller 120 includes a second input 124 for receiving a setting signal $S_{130}$. The setting signal $S_{130}$ includes information relating to the desired impedance $Z_e$ of the circuit 5 between terminals 20 and 30. In response to the first indicator signal $S_{100}$ and the setting signal $S_{130}$ the controller 120 is arranged to generate the first control signal $S_{85}$. The controller 120 is coupled to the input 80 of the signal generator 70 for providing the first control signal $S_{85}$ to the signal generator 70.

FIGS. 6A and 6B

The inventors produced a means 5 wherein the phase angle $\phi$ was varied, while the impedance of the impedance means was measured. The results of the measurements are shown in FIG. 6A.

In order to simplify understanding of the invention, the results of the measurement are shown as separate plots for the resistive part $R_e$ and the reactive part $X_e$ of the impedance $Z_e$. In FIG. 6A an axis 140 indicates the phase angle $\phi = \theta_2 - \theta_1$, and an axis 150 indicates the values of the resistance $R_e$ and the reactance $X_e$.

It can be seen from FIG. 6A that the resistance $R_e$, of the measured impedance means 5, is negative when the phase angle $\phi$ is within a range between zero and $\pi$. The plot of $R_e$ thus indicates that the invention has the advantageous effect of enabling the circuit resistance $R_e$ to reach negative values.

The value of the resistance $R_e$ reaches a minimum when the phase angle $\phi$ is equal to $\pi/2$. When the phase angle $\phi$ equals zero, and when $\phi$ equals $\pi$, the measured resistance $R_e$ corresponds to the series resistance $R_1$. A comparison between the plot of $R_e$ in FIG. 6A with equation (6) indicates that the resistance value $R_e$ equals the sum of the series resistance $R_1$ and the variable resistance $R_v$.

Comparing the plot of $R_e$ in FIG. 6A with equation (2) leads to the conclusion that the variable resistance $R_v$ is zero when the phase angle $\phi$ equals zero and when $\phi$ equals $\pi$.

From the above it is readily understood that the actual resistance $R_e$ is decreased or increased when the phase angle φ is set to deviate from n*π, where n is an integer. The variable resistance $R_v$ is illustrated in FIG. 6B, as a function of the phase angle φ. It can be seen from FIG. 6B that $R_v$ deviates from zero when φ deviates from n*π, where n is an integer. Integers are defined as the positive and negative whole numbers 0, +1, −1, +2, −2, +3, −3, .... The variable resistance $R_v$ is negative when the phase angle φ is in the interval (p−1)*π<φ<p*π where p is an odd integer, p is not zero.

Hence, the actual resistance $R_e$ is decreased when the phase angle φ is in the above mentioned interval.

It can be seen from FIG. 6A that the reactance $X_e$ reaches a minimum when the phase angle φ equals π. A comparison between the plot of the reactance $X_e$ and equation (6) indicates that the reactance $X_e$ equals the sum of the reactance $\omega L_1$ and the variable reactance $X_v$.

An analysis of the plot of $X_e$ in FIG. 6A, in the light of equation (3) leads to the conclusion that $X_e$ equals $\omega L$ when the angle φ equals π/2. The same result is achieved for φ having values nπ/2 where n is an odd integer.

Both of the above described embodiments of the impedance means 5 are advantageously provided as integrated circuits. An integrated circuit comprising an inductance means according to the invention is described in detail below in this specification.

The integrated circuit may be provided on a silicon chip. Such an integrated circuit is, according to one version of the invention, used in a communications system. The impedance means may operate at frequencies ranging from 300 MHz to 30 GHz. According to a preferred embodiment the impedance means operates in a frequency range from 400 MHz to 3 GHz.

A Third Embodiment

From electronic circuit theory it will be remembered that an impedance network with an inductance L coupled in parallel with a capacitance C has a centre frequency $f_c$. If the inductor has a series resistance R the centre frequency is:

$$f_c = 1/[2\pi\sqrt{(LC)}]*\sqrt{[1-(CR^2)/L]} \quad (15)$$

At the centre frequency the total impedance of the impedance network will be at its maximum. At other frequencies the impedance of the network will be lower.

The inventors used this knowledge to design a novel and inventive filter including the impedance means 5.

This is exemplified in FIG. 7 which shows a filter 190 having an input 200 coupled to a first amplifier stage 210. The first amplifier stage 210 has an output 220 which is coupled to an impedance network 230, and to an input 240 of a second amplifier stage 250. The second amplifier stage has an output 254.

The impedance network 230 includes an impedance means 5, as previously described in this text. The terminal 20 of impedance means 5 is coupled to the output 220 of the first amplifier 210, and the terminal 30 is coupled to signal ground. A capacitance means 260 is coupled in parallel with the impedance means 5.

As indicated by equation (3) the impedance means 5 may be controlled to provide inductive reactance (see FIG. 6). By combining the impedance means 5 with the capacitance 260 as described above, the filter 190 will provide a bandpass characteristic.

Applying the bandpass filter 190 in a high frequency circuit makes it possible to provide an input signal comprising a wide range of frequencies to the input 200, and by means of the filter 190 select a narrow frequency range which will be supplied at the output 254.

If a signal comprising frequencies ranging over a wide spectrum having a unity magnitude are provided to the input 200, the signal at the output will have a maximum magnitude at the centre frequency $f_c$ where the impedance is at its maximum.

Figure 8:
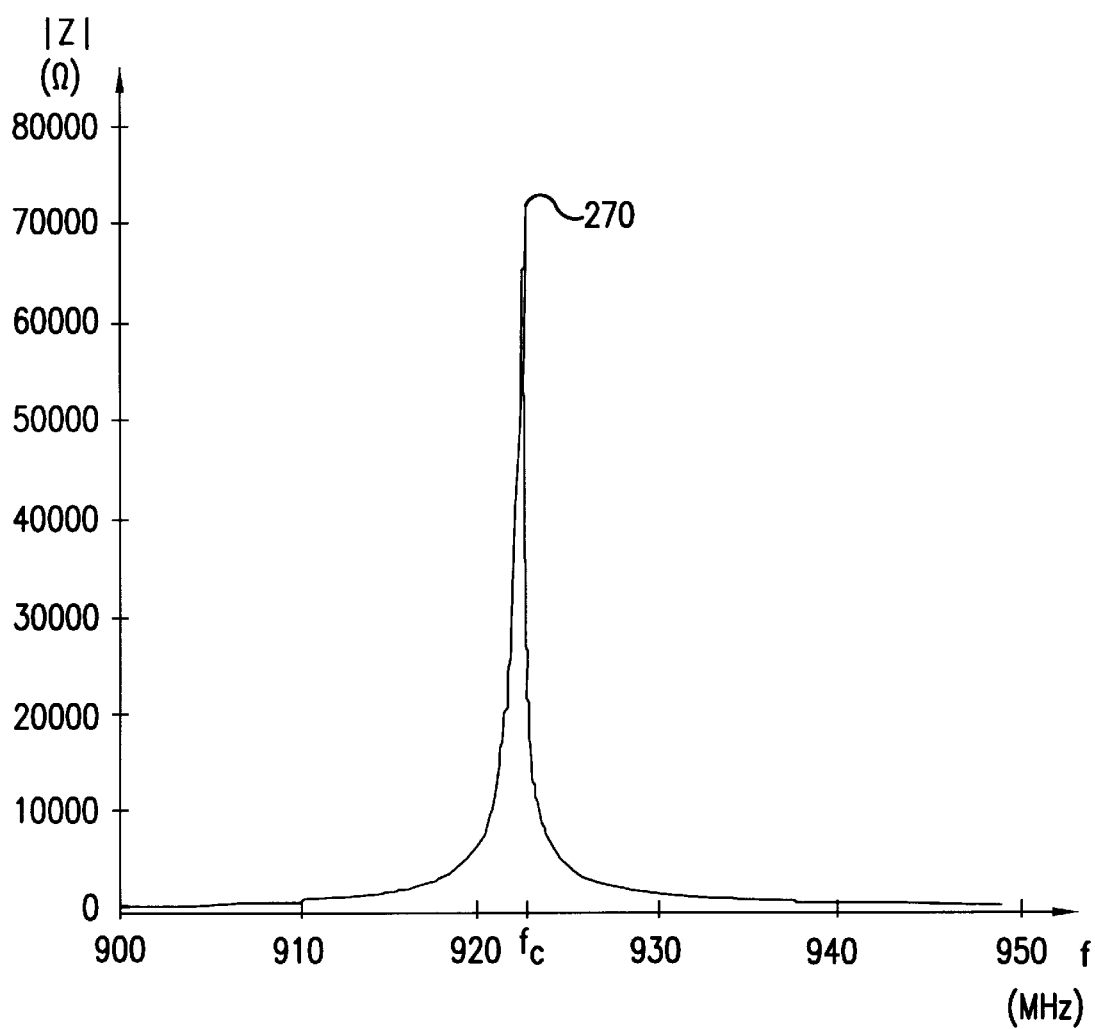
FIG. 8 shows the absolute value of the impedance displayed by an impedance network comprising an inductance means according to the invention, in the frequency range from 800 MHz to 1000 MHz.

FIG. 8 shows the absolute value of the impedance displayed by the impedance network 230 in the frequency range from 900 MHz to 950 MHz.

It can be seen from FIG. 8 that the impedance network 230 provides an advantageously high impedance, indicated by reference numeral 270, at a centre frequency $f_c$. The result shown in FIG. 8 was reached using an impedance means 5, as shown in FIG. 2, connected as shown in FIG. 7. In this example the following values were used:

$L_1$=5 nH $R_1$=5 Ohm $L_{12}$=1.8 nH $f_c$=922.50 MHz

φ=4π/45

The capacitor 260 had the capacitance 6.26 pF. The relation between the amplitudes $|I_2|$ and $|I_1|$ had a certain variation with the frequency. It can be seen from FIG. 6A that when φ is chosen to a value of about 4π/45 the resistance value $R_e$ will be near zero. The absolute value of the impedance between terminal 20 in FIG. 7 and ground exceeded 70 KOhms at the centre frequency $f_c$.

It is readily appreciated that the response curve for the filter indicating the absolute value of the ratio $|V_o/V_i|$, where $V_i$ is the amplitude of the input signal and $V_o$ is the amplitude of the output signal, corresponds to the curve presented in FIG. 8.

The half-power points on the response curve, at which the power is 3 dB below the peak value, are at frequencies $f_1$=922.30 MHz and $f_2$=922.70 MHz, respectively.

It will be remembered from electronic circuit theory that the Q-value may be determined by the formula:

$$Q_o = f_c/(f_2 - f_1)$$

Accordingly, the above described filter 190 provides a quality factor having a $Q_o$-value above 2300.

Using an impedance means 5, according to the invention, as an inductance means in a band pass filter enhances the Q value of the filter, thereby enabling considerably improved selectivity of the filter.

It is to be noted that the inventive filter provides the possibility to control the Q-value of the filter by means of adjusting the resistance value $R_e$. Accordingly, the inventive filter provides an adjustable Q-value. By setting the Q-value of a band pass filter according to the invention to a low value a wider passband will be provided.

A Fourth Embodiment

According to a fourth embodiment of the invention a filter including the impedance means 5 is provided as an integrated circuit.

FIG. 9 is a top view of an integrated version of the inductor 10, being positioned on an integrated circuit 280 so as to provide electromagnetic coupling with the second inductor 40.

The inductors are formed within a first conductor layer 278 on the integrated circuit chip 280. The first inductor 10 is formed as a first conductor which is shaped substantially as a spiral having the first terminal 20 at a peripheral part of the spiral and the second terminal 30 at an interior portion of the spiral. The second inductor 40 is formed by a second conductor which is intercoiled with the first conductor. The intercoiling of the conductors 10 and 40 enables an advantageously large mutual inductance $L_{12}$ between the conductors. The inductors shown in FIG. 9, are shaped substantially as square spirals. According to another embodiment, however, the inductors are formed as substantially circular spirals which are intercoiled. According to still another embodiment the inductors are formed as substantially octagonal spirals which are intercoiled.

Figure 10:
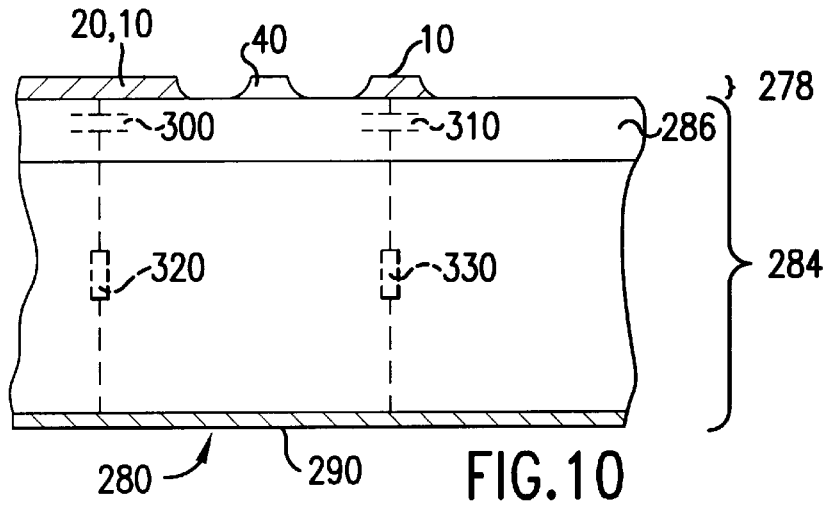
FIG. 10 is a sectional side view of a part of the integrated circuit of FIG. 9.

FIG. 10 is a sectional sideview of a portion of the integrated circuit chip 280 provided with the conductors 10 and 40 on a surface of a semiconductor substrate 284. The semiconductor substrate includes an oxide layer 286 for isolating the conductors 10, 40 from circuitry provided in the semiconductor substrate. The substrate includes a conductive layer 290. The substrate 284 also includes conducting portions and dielectric portions, for connecting the conductors 10 and 40 to other circuit elements. The chip portion shown in FIG. 10 corresponds to a section along the dashed line X—X in FIG. 9. When an inductor is provided as an integrated circuit there are stray capacitances as well as stray resistances in series and in parallel with the inductance value $L_1$. These losses are illustrated by dashed capacitors 300, 310 and dashed resistors 320, 330, respectively in FIG. 10. When two inductors are provided in an integrated circuit, as illustrated in FIG. 9, there may be stray capacitances (not shown) between the conductors 10 and 40. In case of such stray capacitance between the conductors the electromagnetic coupling between the inductors may include a capacitive coupling, and this will have to be considered when the phase angle $\phi$ is adjusted. In case of capacitive coupling between the conductors, the phase of the feedback signal generated in the first conductor 10 in response to the electric signal in conductor 40, may deviate from the phase angle $\theta_2$.

Figure 11:
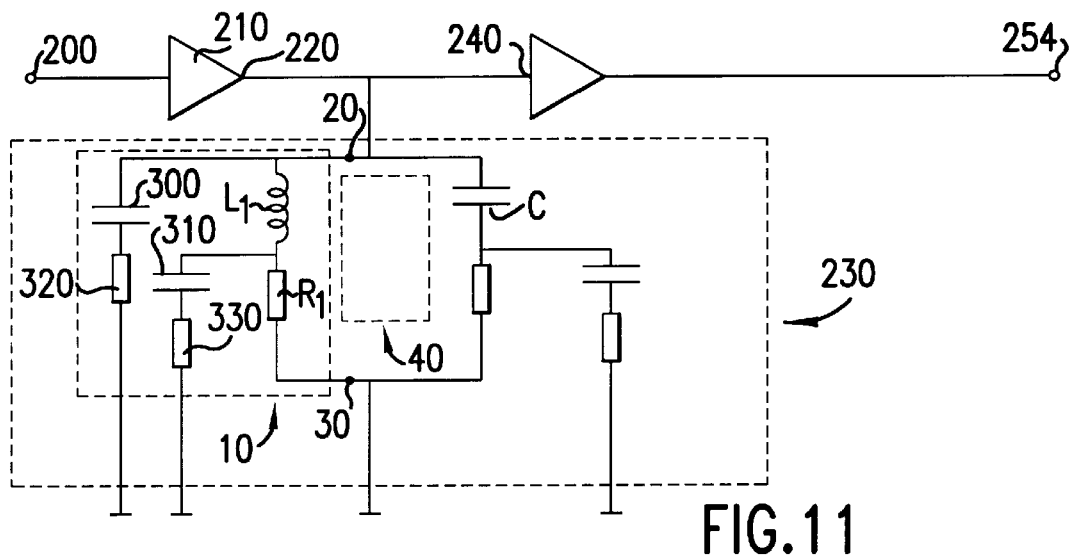
FIG. 11 is an equivalent circuit diagram of a band pass filter, wherein an impedance network is provided in an integrated circuit in accordance with FIG. 10.

FIG. 11 shows an equivalent circuit diagram of the bandpass filter 190 having the impedance network 230 comprising the first conductor 10 and the second conductor 40 provided in accordance with FIGS. 9 and 10. The above described stray resistances 320 and 330 and the parasitic capacitances 300 and 310 are included in the equivalent circuit in FIG. 11.

The provision of the second inductor 40 in combination with the signal generator 70 makes it possible to compensate for some, or all, of the power losses illustrated by the described stray and loss impedances $R_1$, 320, 330, 300 and 310. This compensation is achieved by tuning the above described variables $R_v$ and $X_v$ to desired values. The inventive provision of an inductance means 5 on an integrated circuit, thus enables substantial improvement of the performance of integrated circuitry.

The above described embodiment exemplifies the integrated circuit as a bandpass filter. Also within the scope of the invention are lowpass filters and highpass filters as well as other integrated circuitry including one or several impedance means 5. The impedance means according to the invention can advantageously be provided in a filter for a radio receiver.

A Fifth Embodiment

From resonance theory it will be remembered that a circuit including reactive elements can be set up to oscillate at a certain frequency. The oscillation frequency depends on the resonance frequency of the circuit. The resonance frequency may be determined by the above described equations (13) or (15).

According to a fifth embodiment of the invention there is provided resonator 400 including an impedance means having a first inductor 10 and a second inductor 40. There is a mutual inductance $L_{12}$ between the first inductor 10 and the second inductor 40. The second inductor 40 has a terminal 50.

Figure 12:
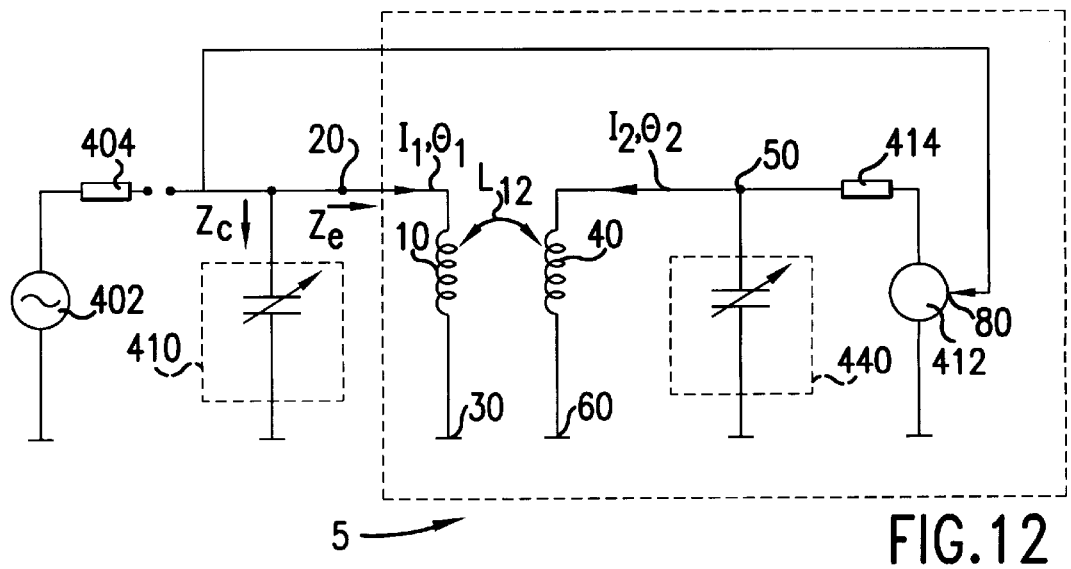
FIG. 12 is a schematic block diagram of a resonator according to the invention.

A schematic block diagram showing the principle for a resonator 400 according to the invention is shown in FIG. 12. A signal source 402 can be coupled via a source impedance 404 to terminal 20 of the first inductor 10. A first varactor 410 is coupled between the terminal 20 and signal ground.

A signal source 412, having a source impedance 414, is coupled to terminal 50 of the second inductor. A second varactor 440 is coupled between terminal 50 and signal ground.

The source 412, the impedance 414 and the varactor 440 corresponds to the signal source 70 which was described in connection with FIG. 2 above. Accordingly, FIG. 12 illustrates the inductance means 5, in accordance with the invention, connected in parallel with a first varactor 410.

The varactor 440 can be tuned to provide a capacitance value which sets the phase angle difference $\phi$ to a chosen value. Accordingly the angle $\phi$ can be chosen so as to set the reactance of the reactance means 5 to a predominantly inductive value.

When the resonator circuit 400 is activated an oscillation may be initiated by the source 402. The signal source 412 generates a signal, the amplitude and phase of which depends on the amplitude and phase of the signal at terminal 20. The signal source 412 may for example include a bipolar transistor, the base 80 of which is coupled to terminal 20 and the smatter of which is coupled to terminal 50.

The predominantly capacitive impedance $Z_c$ of the varactor 410 co-operates with the inductive impedance $Z_e$ of the reactance means 5. The resonance frequency is dependent on the capacitance of the varactor and the inductance of impedance means 5.

$$f_{or} \approx 1/[\sqrt{(Z_c \cdot Z_e)}] \tag{16}$$

The resonance frequency $f_{or}$ can be adjusted by varying the capacitance $Z_c$ of the first varactor 410.

The phase angle $\Theta_2$ of the signal $I_2$ provided to the second inductor 40 can be adjusted by varying the capacitance of the second varactor 440.

It has been described above that an adjustment of the phase angle $\Theta_2$ corresponds to an adjustment of the phase angle difference $\phi$, and that the impedance $Z_e$ depends on the angle $\phi$. Accordingly the Q-value of the resonator is electronically adjustable by means of the second varactor 440.

FIG. 13

Figure 13:
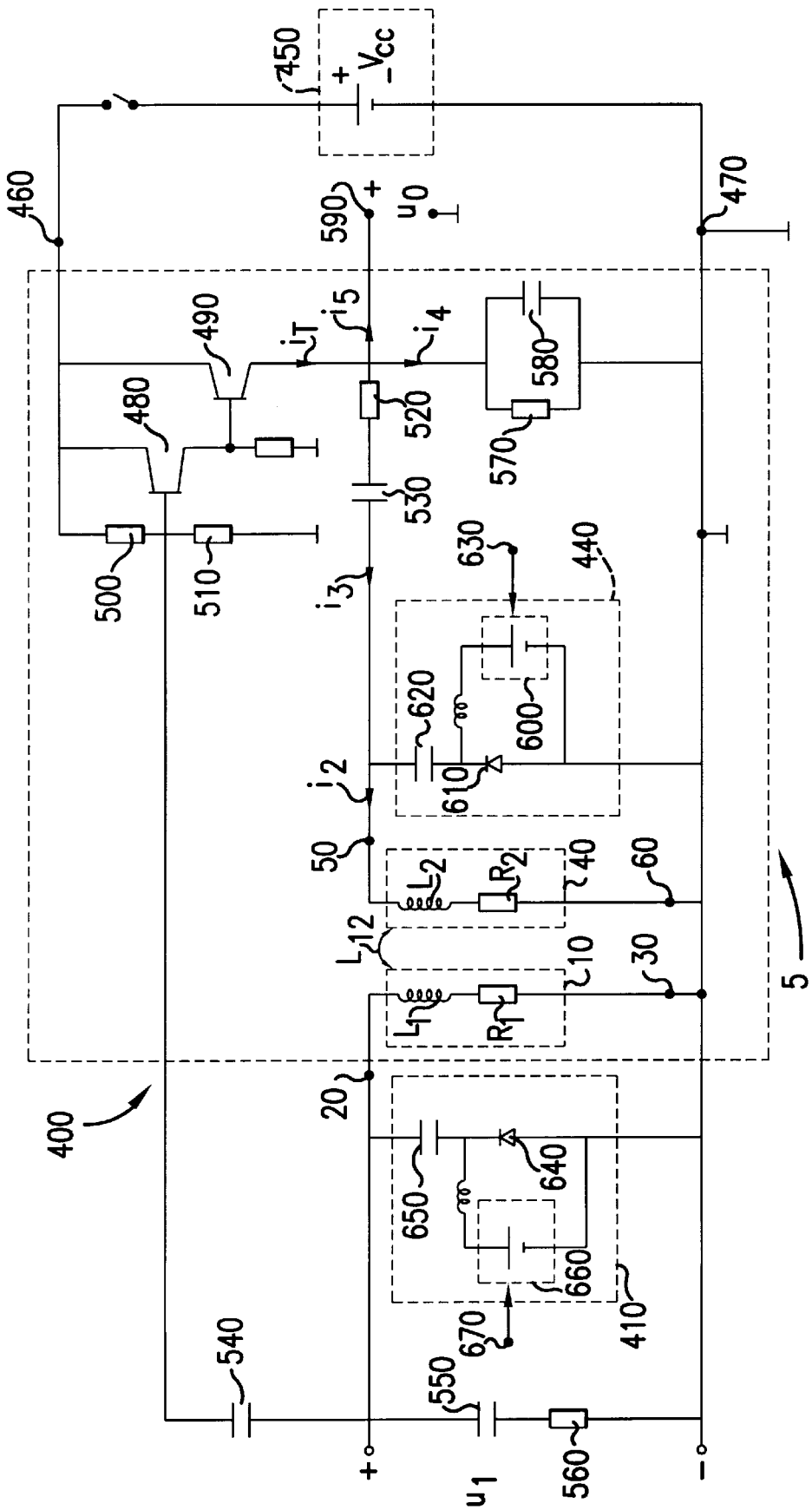
FIG. 13 is a more detailed schematic representation of the resonator in FIG. 12

FIG. 13 shows a detailed schematic of an embodiment of the resonator circuit 400.

A power source 450 provides a positive supply voltage $+V_{cc}$ to a power terminal 460. The power source 450 has a negative pole which is connected to a negative power terminal 470. In the embodiment shown the terminal 470 is connected to signal ground.

A transistor 480 has its collector connected to terminal 460, and its emitter connected to the base of another transistor 490. A resistor 500 is connected between the collector and the base of the first transistor 480. Another resistor 510 is connected between the base of the transistor 480 and ground.

The collector of the second transistor 490 is connected to the positive power terminal 460, and its emitter is connected to terminal 50 of the second inductor 40 via a resistor 520 and a capacitor 530. The other terminal 60 of inductor 40 is connected to signal ground.

The base of the first transistor 480 is connected to terminal 20, of the first inductor 10, via a capacitor 540. A capacitor 550 and a resistor 560 are connected in series between terminal 20 and signal ground. A variable capacitance means 410 is coupled between terminal 20 and signal ground.

Another variable capacitance means 440 is coupled between terminal 50 and signal ground.

The variable capacitance means 440 is a varactor 440. According to one embodiment the varactor 440 includes a varactor diode 610, the anode of which is coupled to signal ground and the cathode of which is coupled to terminal 50 via a capacitor 620. A voltage source 600 is coupled to the varactor diode for providing a DC voltage in the reverse direction across the diode. Accordingly the capacitance value provided by the varactor diode can be varied in response to the voltage provided by the voltage source 600. The voltage source 600 includes a control input 630 for varying the DC voltage in response to a control signal.

The variable capacitance means 410 is a varactor. According to one embodiment the varactor 410 includes a varactor diode 640, the anode of which is coupled to signal ground and the cathode of which is coupled to terminal 20 via a capacitor 650. A DC voltage source 660, having a control input 670, provides a reverse voltage across the diode 640, in response to a control signal provided to the control input 670.

A resistor 570 and a capacitor 580 are connected in parallel between the emitter of transistor 490 and signal ground. The emitter of transistor 490 is connected to an output terminal 590.

When the power source 450 is connected to provide a supply voltage $V_{cc}$ between power terminals 460 and 470, there will be a voltage $u_1$ between terminal 20 and ground, due to voltage division over the components 500, 510 and the components 540, 550, 560, 410 and 10. The resonator circuit will start oscillating at a frequency determined substantially by the inductance $Z_e$ of the inductance means 5 and the capacitance of the capacitance means 410.

During oscillation the signal voltage $u_1$ will oscillate. The voltage over resistor 510 will vary in response to $u_1$. Transistor 480 amplifies the signal thus provided at its base electrode. The amplified signal is provided to the base of transistor 490, which in turn provides a corresponding signal to terminal 590.

Accordingly the signal $u_0$ provided at terminal 590 is an amplified signal corresponding to the signal voltage $U_1$.

Transistor 490 provides a signal current $i_T$ which is divided into a current $i_3$, a current $i_4$ and a current $i_5$.

In response to the current $i_3$ there will be a current $i_2$ through the second inductor 40. The phase angle $\ominus_2$ of the current $i_2$ is adjustable in response to the capacitance of the capacitance means 440.

The amplitude of the second current $i_2$ is determined by setting up the transistors 480 and 490 to a suitable degree of amplification.

Thus, when the voltage $u_1$ oscillates there will be provided an oscillating current $i_2$ with a certain amplitude $I_2$ and a certain phase angle $\ominus_2$ to the second inductor 40.

The provision of the second current $i_2$ in response to the first signal $u_1$, leads to advantageous performance of the circuit, as described above in connection with FIGS. 2 to 6.

The resonator circuit 400 is advantageously provided as an integrated circuit, with integrated inductors, as described above in connection with FIG. 9.

What is claimed is:

1. A method for controlling impedance of a device, the device comprising a first conductor and a second conductor, the first and second conductors being positioned in relation to each other so as to provide electromagnetic coupling between them, the first conductor exhibiting a device resistance and a device reactance, the method comprising the steps of:

receiving, in the first conductor, a first electric signal having a first amplitude and a first phase angle;

generating a second electric signal having a second amplitude and a second phase angle;

delivering the second electric signal to the second conductor; and controlling said second phase angle in relation to said first phase angle such that said device resistance is changed.

2. The method according to claim 1, further comprising a step of generating a first control signal in response to said first electric signal.

3. The method according to claim 1, further comprising the step of:

adjusting said second phase angle in relation to said first phase angle such that a reduction of the resistance of said device is achieved.

4. The method according to claim 1, further comprising the step of:

adjusting said second phase angle in relation to said first phase angle such that a phase difference is provided between said first phase angle and said second phase angle.

5. The method according to claim 1, further comprising the step of:

adjusting said second phase angle in relation to said first phase angle such that an adjustment of the reactance of said device is achieved.

6. The method according to claim 1, further comprising the step of:

maintaining a predetermined difference between said second phase angle and said first phase angle.

7. The method of claim 1, wherein the impedance is controlled in a high frequency resonator.

8. The method of claim 1, wherein the impedance is controlled in a filter.

9. The method of claim 1, wherein the impedance is controlled in a radio receiver.

10. In a device having a first conductor and a second conductor, the first and second conductors having a mutual electromagnetic coupling between them, the first conductor exhibiting a device resistance and a device reactance, a method comprising the steps of:

generating a first signal having a first amplitude and a first phase angle;

providing said first signal to said first conductor;

generating a feedforward signal corresponding to said first signal;

generating a second signal in response to said feedforward signal, said second signal having a second amplitude and a second phase angle;

providing said second signal to said second conductor; and controlling said second phase angle in relation to the first phase angle such that said device resistance exhibited by said first conductor is changed.

11. The method according to claim 10, wherein the step of controlling said second phase angle comprises:

controlling said second phase angle such that a phase difference is provided between said first phase angle and said second phase angle.

12. The method according to claim 10, wherein the step of controlling said second phase angle comprises:

providing said feedforward signal to a control means having an input for a control signal, and influencing said second phase angle in response to said control signal.

13. An apparatus comprising:

a first conductor being adapted to receive a first electric signal having a first amplitude and a first phase angle;

the first conductor exhibiting a resistance and a reactance;

a second conductor, said second conductor being positioned in relation to said first conductor such that magnetic coupling is provided between said first and second conductors; and a signal generator being actuatable to generate a second electric signal, said second electric signal having a second amplitude and a second phase angle;

said signal generator being coupled to said second conductor for providing said second electric signal to said second conductor, wherein said signal generator is devised to control the second phase angle in relation to the first phase angle such that said resistance exhibited by the first conductor is changed.

14. The circuit component according to claim 13, wherein said first conductor is an inductor, and said second conductor is an inductor.

15. A circuit component having a first terminal and a second terminal for receiving a first electric signal having a first amplitude and a first phase angle, the component having a component resistance between said first and second terminals, the component comprising:

a first conductor coupled to the first terminal and to the second terminal;

a second conductor, said second conductor being electromagnetically coupled to said first conductor;

a sensor for generating an indicator signal corresponding to said first electric signal; and a controller for controlling the impedance of the component, said controller having a first input for receiving said indicator signal and a second input for receiving an adjustable setting signal, said controller being devised to generate a second electric signal in response to said indicator signal and said setting signal, said second electric signal having a second amplitude and a second phase angle, said controller being coupled to said second conductor in order to provide said second electric signal to said second conductor, and said controller comprising means for controlling said second phase angle in relation to the first phase angle such that the component resistance is changed.

16. The circuit component according to claim 15, wherein said controller is devised to generate said second electric signal such that said component resistance is decreased.

17. An apparatus having a first terminal and a second terminal, the apparatus having an apparatus resistance and an apparatus reactance between the first and second terminals, the apparatus comprising:

a first inductor coupled to the terminals for receiving a first oscillating electric signal having a first amplitude and a first phase angle, the first inductor exhibiting the apparatus resistance during operation of the apparatus;

a second inductor, said second inductor having a mutual electromagnetic coupling to said first inductor; and a signal generator for generating a second oscillating electric signal dependent on said first electric signal, said second electric signal having a second amplitude and a second phase angle, said signal generator providing said second oscillating electric signal to said second inductor such that a feedback signal is generated in the first inductor in response to the second oscillating electric signal, wherein said signal generator comprises means for controlling said second phase angle in relation to said first phase angle, thereby controlling the apparatus resistance.

18. The apparatus according to claim 17, wherein said control means is devised to control the second phase angle such that said apparatus resistance is reduced.

19. The apparatus according to claim 17, wherein said signal generator is devised to provide said second electric signal to said second inductor such that a phase difference is provided between said first phase angle and said second phase angle for controlling the resistance of the apparatus.

20. The apparatus according to claim 19, wherein said control means is devised to control the phase difference to a pre-set value deviating from zero such that said resistance is changed.

21. The apparatus according to claim 19, wherein said control means is devised to control the phase difference to a pre-set value deviating from zero such that said resistance is decreased.

22. The apparatus according to claim 19, wherein said control means is devised to adjustably control the phase difference to a value deviating from zero such that said resistance is changed.

23. The apparatus according to claim 19, wherein said signal generator is devised to adjustably control the phase difference to a value deviating from zero such that said resistance is decreased.

24. The apparatus according to claim 19, wherein said signal generator is devised to generate said second electric signal such that the phase difference is controlled to deviate from $n*[n]\pi$, where n is an integer.

25. The apparatus according to claim 19, wherein said signal generator is arranged to generate said second electric signal such that the phase difference is ($\phi$) controlled to a value in the interval $(p-1)*\pi<\phi<p*\pi$ where p is an odd integer, and p is not zero.

26. The apparatus according to claim 19, wherein said signal generator is arranged to generate said second electric signal in response to said first electric signal.

27. The apparatus according to claim 17, wherein said first inductor has a first resistance value and said second inductor having a second resistance value, said electromagnetically coupled inductors being arranged to generate a third resistance value, the apparatus resistance between the first and the second terminals being substantially the sum of said first resistance value of said first inductor and said third resistance value of said electromagnetically coupled inductors.

28. The apparatus according to claim 17, wherein said first inductor has a first reactance value and said second inductor has a second reactance value, said electromagnetically coupled inductors being arranged to generate a third reactance value, the apparatus reactance between the first and the second terminals depending on said first reactance value of said first inductor and said third reactance value of said electromagnetically coupled inductors.

29. The apparatus according to claim 17, further comprising:
a sensor means for generating said second electric signal in response to said first electric signal.

30. The apparatus according to claim 17, wherein said control means comprises:
an input for an adjustment signal,
said control means being devised to control said second phase angle in response to said adjustment signal.

31. An integrated circuit chip inductance apparatus comprising a first terminal and a second terminal, the inductance apparatus having an apparatus resistance and an apparatus reactance between the first and second terminals, the inductance apparatus comprising:
a first inductor coupled to the terminals for receiving a first oscillating electric signal having a first amplitude and a first phase angle;
a second inductor, said second inductor having a mutual electromagnetic coupling to said first inductor; and
a signal generator for generating a second oscillating electric signal dependent on said first electric signal, said second electric signal having a second amplitude and a second phase angle,
said signal generator providing said second oscillating electric signal to said second inductor such that a feedback signal is electromagnetically generated in the first inductor in response to the second oscillating electric signal,
wherein said signal generator comprises means for controlling said second phase angle in relation to said first phase angle such that said feedback signal affects the apparatus resistance.

32. The integrated circuit chip according to claim 31, wherein said first inductor includes a conductor which is shaped as a spiral; and
said second inductor includes a conductor which is shaped as a spiral,
said first spiral and said second spiral being intercoiled.

33. The integrated circuit chip according to claim 32, wherein said spirals are substantially square.

34. The integrated circuit chip according to claim 32, wherein said spirals are substantially circular.

35. The integrated circuit chip according to claim 31, wherein
said first inductor includes a conductor which is shaped as a spiral;
said second inductor includes a conductor which is shaped as a spiral; and
said first spiral and said second spiral are formed as substantially flat spirals.

36. An electronically tunable frequency resonant circuit, comprising:
an inductance device having a first terminal and a second terminal, the inductance device having a first resistance and a first inductance between the first and second terminals, the inductance device comprising:
a first inductor coupled to the terminals for receiving a first oscillating electric signal having a first amplitude and a first phase angle;
a second inductor, said second inductor having a mutual electromagnetic coupling to said first inductor; and
a signal generator for generating a second oscillating electric signal dependent on said first electric signal, said second electric signal having a second amplitude and a second phase angle;
said signal generator providing said second oscillating electric signal to said second inductor such that a feedback signal is generated in the first inductor in response to the second oscillating electric signal;
wherein said signal generator comprises means for controlling said second phase angle in relation to said first phase angle such that said feedback signal affects the first resistance; and
a capacitance device having a first capacitance value, said first capacitance value being electronically adjustable;
said capacitance device being coupled in combination with said inductance device so as to resonate at a selected frequency dependent on said first capacitance value and said first inductance.

37. The electronically tunable frequency resonant circuit according to claim 36, wherein said selected frequency depends on a phase difference.

38. An oscillator circuit comprising an inductance device having a resistance and a reactance, the inductance device comprising:
a first terminal and a second terminal, the inductance device having a device resistance and a device reactance between the first and second terminals;
a first inductor coupled to the terminals for receiving a first oscillating electric signal having a first amplitude and a first phase angle;
a second inductor, said second inductor having a mutual electromagnetic coupling to said first inductor; and
a signal generator for generating a second oscillating electric signal dependent on said first electric signal, said second electric signal having a second amplitude and a second phase angle,
said signal generator providing said second oscillating electric signal to said second inductor such that a feedback signal is generated in the first inductor in response to the second oscillating electric signal,
wherein said signal generator comprises means for controlling said second phase angle in relation to said first phase angle such that said feedback signal affects the device resistance.

39. A filter circuit comprising an inductance device having a first terminal and a second terminal, the inductance device having a resistance and a reactance between the first and second terminals, the inductance device comprising:
a first inductor coupled to the terminals for receiving a first oscillating electric signal having a first amplitude and a first phase angle;
a second inductor, said second inductor having a mutual electromagnetic coupling to said first inductor; and
a signal generator for generating a second oscillating electric signal dependent on said first electric signal, said second electric signal having a second amplitude and a second phase angle,
said signal generator providing said second oscillating electric signal to said second inductor such that a feedback signal is generated in the first inductor in response to the second oscillating electric signal,
wherein said signal generator comprises means for controlling said second phase angle in relation to said first phase angle such that said feedback signal affects the resistance between the first and second terminals.

40. The filter circuit according to claim 39, further comprising:
a capacitance device which is coupled such that it co-operates with said inductance device.

* * * * *